(12) United States Patent  (10) Patent No.: US 7,694,444 B2
Miller et al.  (45) Date of Patent: Apr. 13, 2010

(54) ELECTRONIC SIGN HAVING A FORMED METAL CABINET

(75) Inventors: Kent S. Miller, Brookings, SD (US); Todd M. Letcher, Aberdeen, SD (US); Nathan L. Nearman, Brookings, SD (US); Lane A. Munson, Brookings, SD (US); Cassandra L. Fuls, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 98 days.

(21) Appl. No.: 11/809,107

(22) Filed: May 31, 2007

(65) Prior Publication Data

US 2009/0021127 A1 Jan. 22, 2009

(51) Int. Cl.
*G09F 9/37* (2006.01)
(52) U.S. Cl. .............. 40/446; 40/793; 40/448; 40/452
(58) Field of Classification Search .............. 40/735, 40/605, 576, 618, 448, 446, 793, 611.02, 40/790, 574, 578; 52/58, 272, 475.1
See application file for complete search history.

(56) References Cited

U.S. PATENT DOCUMENTS

| | | | |
|---|---|---|---|
| 2,053,547 A | 9/1936 | Austin | |
| 3,594,761 A | 7/1971 | Boesen | |
| 4,234,914 A | 11/1980 | Boesen | |
| 5,172,504 A | 12/1992 | De Maat et al. | |
| 5,268,828 A | 12/1993 | Miura | |
| 5,321,417 A | 6/1994 | Voelzke et al. | |
| 5,647,152 A | 7/1997 | Miura | |
| 5,692,855 A | 12/1997 | Burton | |
| 5,715,619 A | 2/1998 | Polisois et al. | |
| 6,154,945 A * | 12/2000 | Voelzke | 29/426.5 |
| 6,169,632 B1 * | 1/2001 | Kurtenbach et al. | 359/621 |
| 6,314,669 B1 * | 11/2001 | Tucker | 40/448 |
| 6,508,494 B1 | 1/2003 | Reuter et al. | |
| D482,403 S * | 11/2003 | Rose | D20/19 |
| 6,677,918 B2 * | 1/2004 | Yuhara et al. | 345/1.3 |
| 6,729,054 B1 | 5/2004 | VanderTuin | |
| 6,741,222 B1 * | 5/2004 | Tucker | 345/1.1 |
| 6,813,853 B1 * | 11/2004 | Tucker | 40/448 |
| 7,091,933 B2 * | 8/2006 | McClintock et al. | 345/55 |
| 7,373,747 B1 * | 5/2008 | Wiemer et al. | 40/605 |
| 2003/0217495 A1 | 11/2003 | Nagamine et al. | |
| 2008/0060234 A1 | 3/2008 | Chou | |

FOREIGN PATENT DOCUMENTS

| | | | |
|---|---|---|---|
| JP | 8140023 | A2 | 5/1996 |
| JP | 11265153 | A2 | 9/1999 |
| JP | 2001350434 | A2 | 12/2001 |

OTHER PUBLICATIONS 08165444.4, "European Application No. 08165444.4 European search report mailed Mar. 4, 2009", 9.

* cited by examiner

*Primary Examiner*—Joanne Silbermann
*Assistant Examiner*—Shin Kim
(74) *Attorney, Agent, or Firm*—Schwegman, Lundberg & Woessner, P.A.

(57) ABSTRACT

An electronic sign having a formed metal cabinet where precise and close tolerance formed planar panels and formed channels are fastened together only by rivets, nut inserts or the combination thereof for rapid assembly thereof.

29 Claims, 7 Drawing Sheets

ELECTRONIC SIGN HAVING A FORMED METAL CABINET

CROSS REFERENCES TO RELATED APPLICATIONS

This application is related to U.S. utility patent application Ser. No. 10/688,304 filed Oct. 17, 2003, entitled "Electronic Display Module Having a Four-Point Latching System for Incorporation into an Electronic Sign and Process", now U.S. Pat. No. 7,055,271 B2 to Lutz et al., Jun. 6, 2006, which is incorporated herein by reference.

BACKGROUND OF THE INVENTION

1. Field of the Invention

The present invention is for an electronic sign and, more particularly, pertains to the construction of an electronic sign by using precise formed structures, rivets, nut inserts, and adhesive coated tape to assemble structural members of the sign.

2. Description of the Prior Art

Prior art electronic signs included a cabinet structure which was labor intensive in constructing and, therefore, time consuming, requiring alignment of components and subsequent drilling, riveting, welding and other techniques. In addition, the components used for the fabrication of sign cabinets were extruded and not reliably true and straight, whereby suitable mating of components to the cabinet or mating of one cabinet to another adjacent cabinet proved to be not entirely satisfactory.

SUMMARY OF THE INVENTION

The general purpose of the present invention is to provide an electronic sign having a formed metal cabinet whereby the cabinet can be fabricated using precision formed channels, precision formed panels, and the like. A plurality of formed components, which can include precision cut or stamped channels, are combined to make a formed metal cabinet for use with electronic display modules to provide an electronic sign having a formed metal cabinet. The components are considered to be formed components made by precise cutting, stamping, bending, laser cutting, and the like in order to provide uniformly shaped components of close tolerance and fit which can be planar two dimensional components or which can be multiple faced components in more than one plane. A plurality of vertically oriented formed channels and formed mid-channels are secured and aligned between a formed top channel and a formed bottom channel. Formed top, bottom and end panels include a plurality of different sized counter bored holes which can accommodate the flush mounting of rivet heads or nut insert heads. A double-sided adhesive coated tape is used to secure and seal the formed top, bottom, and end panels to the appropriate formed channels and formed mid-channels. A mounting panel for accommodating electronic display modules has counter bored holes therein to accommodate rivet heads. A double-sided adhesive coated tape is used to secure and sealingly fasten the mounting panel to the front lips of vertically oriented formed channels and formed mid-channels and to the front lip of the formed top channel and to the front lip of the bottom formed channel. A rear access panel is sealingly secured to the back lips of the vertically oriented formed channels and formed mid-channels and to the back lips of the formed top and bottom channels by the use of rivets and a double-sided adhesive coated tape. The flush mounting feature of using counter bored holes allows for the vertical or horizontal alignment of one electronic sign to an adjacent electronic sign without any rivet head interference. The use of rivets and nut inserts in conjunction with the use of a double-sided adhesive coated tape allows for the rapid assembly of the formed metal cabinet without having to drill matching holes between planar or channel components and without using other labor intensive construction techniques.

According to one or more embodiments or illustrations of the present invention, there is provided an electronic sign having a formed metal cabinet, including a central portion with vertically oriented formed channels, vertically oriented formed mid-channels, horizontally oriented top and bottom formed channels, horizontally oriented formed top and bottom panels, vertically oriented formed end panels, a mounting panel for accommodating electronic display modules, a rear access panel having access door panels, a plurality of double-sided adhesive coated tapes, and a plurality of rivets and nut inserts.

One significant aspect and feature of the present invention is to provide an electronic sign having a formed metal cabinet.

Another significant aspect and feature of the present invention is the use of precision cut and close tolerance formed planar panels or formed channels for simplifying the assembly process.

Still another significant aspect and feature of the present invention is the use of planar formed panels having counter bored holes for flush accommodation of rivet heads and rivet bodies and for flush accommodation of insert nut heads and bodies.

Yet another significant aspect and feature of the present invention is the use of a plurality of rivets and nut inserts or combinations thereof to fasten adjacent formed components.

A further significant aspect and feature of the present invention is the use of a double-sided adhesive coated tape as a seal and as an attachment interface between formed components.

Yet another significant aspect and feature of the present invention is the use of a plurality of rivets and nut inserts or combinations thereof in combination with a double-sided adhesive coated tape to fasten adjacent formed components.

Still another significant aspect and feature of the present invention is the use of formed sheet metal for supports instead of metal extrusions.

Yet another significant aspect and feature of the present invention is the use of formed sheet metal for supports instead of metal extrusions, whereby sheet metal can be formed more accurately and precisely than metal can be extruded.

Still another significant aspect and feature of the present invention is the use of rivets, nut inserts, and double-sided adhesive coated tape for fastening instead of weldments which require transfer of components in different stages of assembly to one or more welding areas.

Still another significant aspect and feature of the present invention is the use of prepunched and pre-counter bored holes that were punched by a CNC machine.

Having thus briefly described embodiments of the present invention and having mentioned some significant aspects and features of the present invention, it is the principal object of the present invention to provide an electronic sign having a formed metal cabinet.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
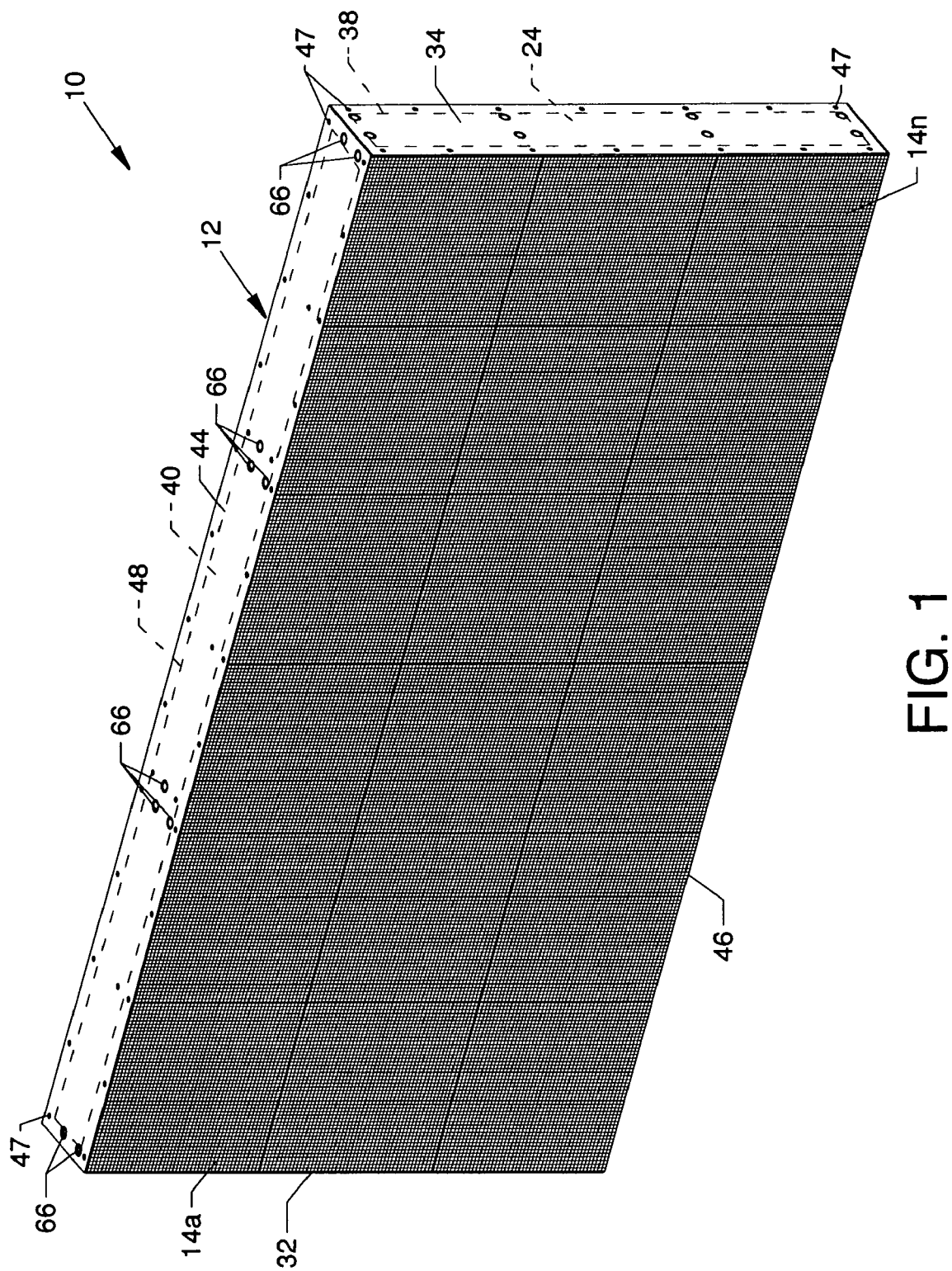
FIG. 1 is a front isometric view of an electronic sign having a formed metal cabinet, the present invention.
Figure 2:
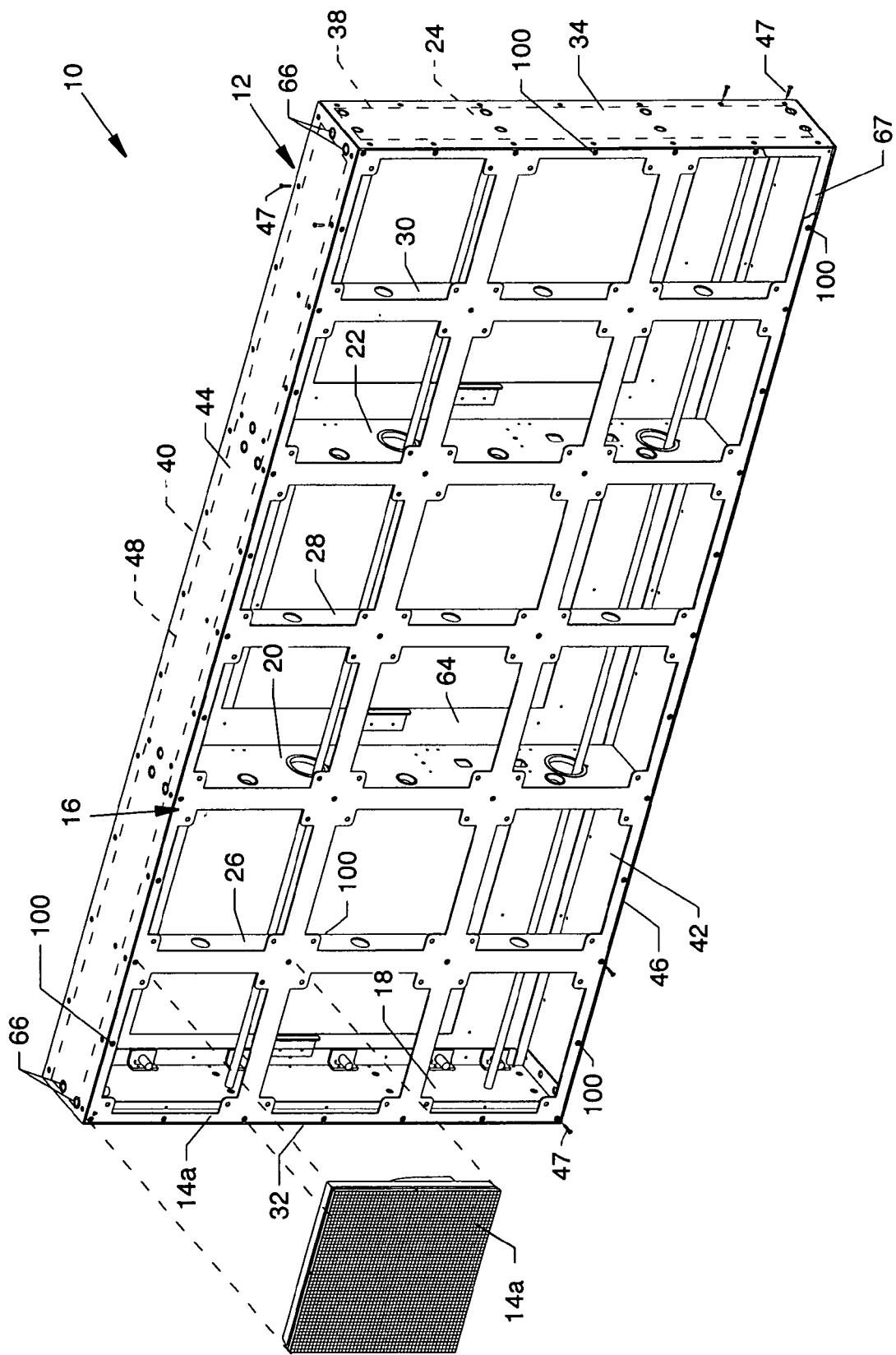
FIG. 2 is a front isometric view of an electronic sign having a formed metal cabinet where one display module is shown distanced from a mounting panel.

FIG. 1 is a front isometric view of an electronic sign 10 having a formed metal cabinet 12, the present invention. A plurality of electronic display modules having a four-point latching system, herein referred to as the display modules 14a-14n, removably attach to the front of a formed metal cabinet 12. FIG. 2 is a front isometric view of an electronic sign having a formed metal cabinet 12 where only one display module 14a is shown distanced from a mounting panel 16. The mounting panel 16, a part of the formed metal cabinet 12, is used to mount the plurality of display modules 14a-14n. The relationship of the mounting panel 16 and the display modules 14a-14n is described in U.S. Pat. No. 7,055,271 entitled "Electronic Display Module Having a Four-Point Latching System for Incorporation into an Electronic Sign and Process". Other components of the formed metal cabinet 12 are viewable through the structure of the mounting panel 16 and are described later in detail, whereby reference to FIG. 2 is beneficial.

Figure 3:
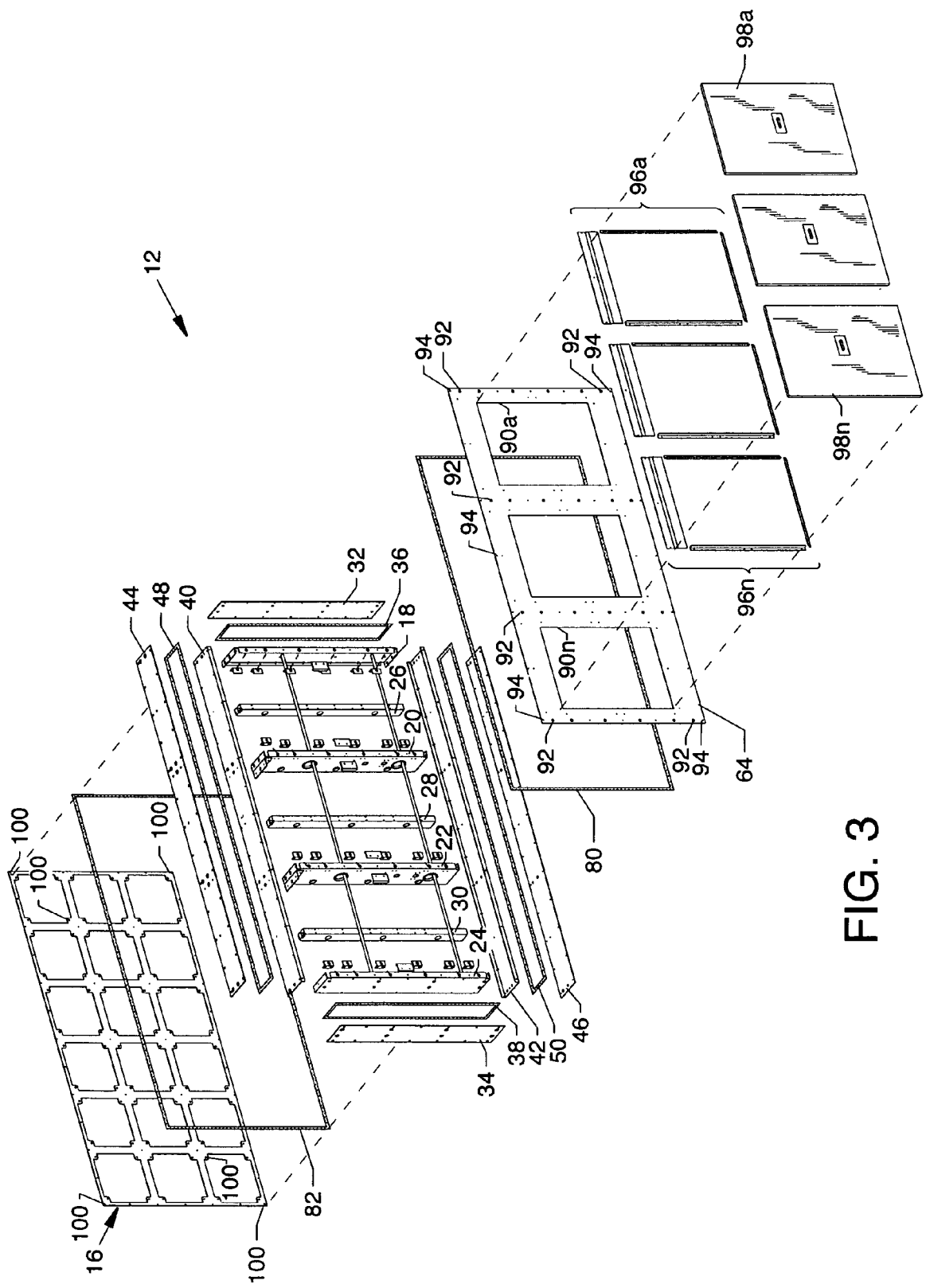
FIG. 3 is an exploded rear isometric view of the formed metal cabinet.
Figure 4:
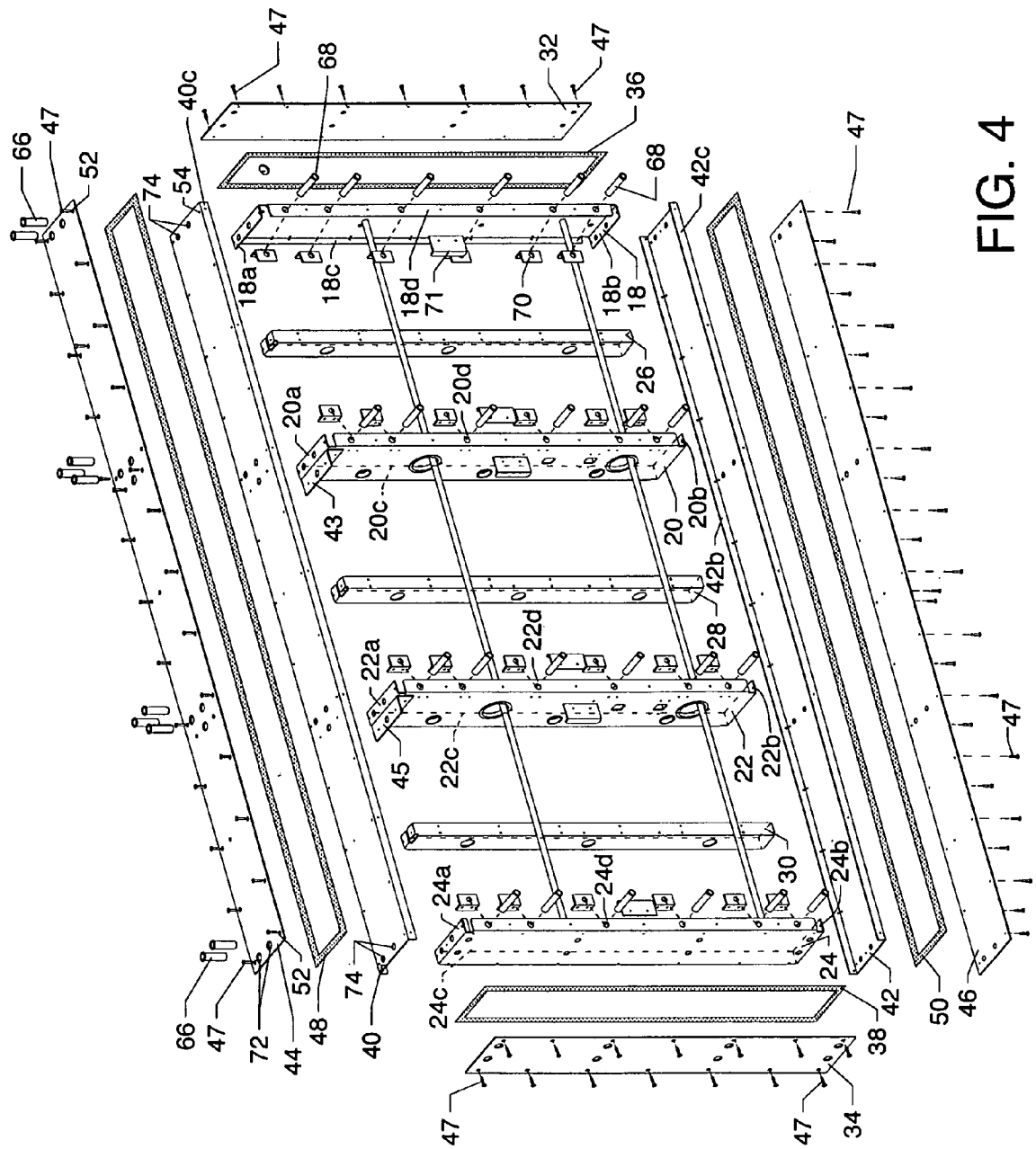
FIG. 4 is an exploded rear isometric view of the formed channel and formed planar components at the central portion of the formed metal cabinet.
Figure 5:
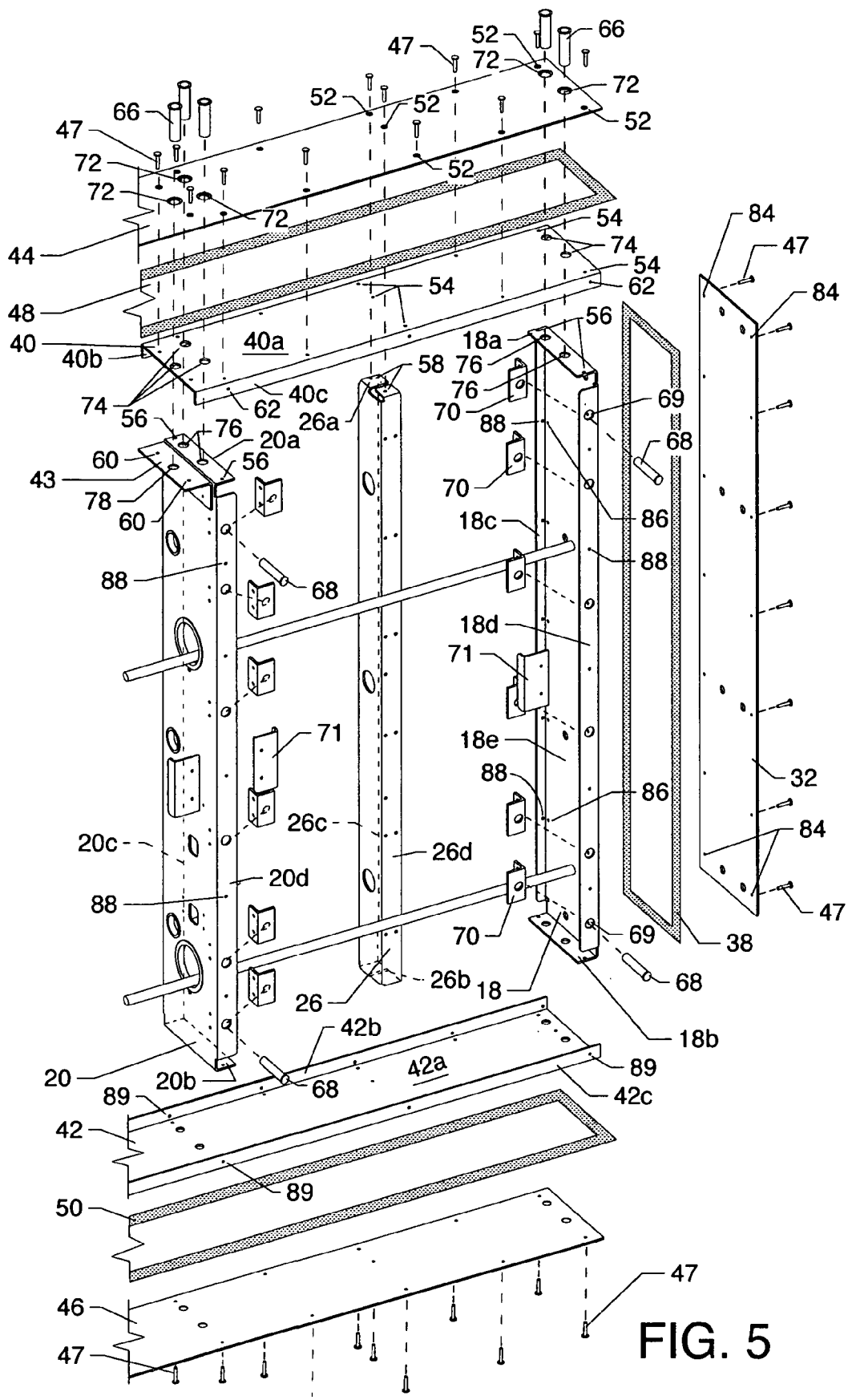
FIG. 5 is an amplified view of one end of the invention including components above and below, as well as to one side of a plurality of formed channel components, as well as other closely associated components.

FIG. 3 is an exploded rear isometric view of the formed metal cabinet 12, FIG. 4 is an exploded rear isometric view of the formed channel and formed planar components at the central portion of the formed metal cabinet 12, and FIG. 5 is an amplified view of one end of the invention where each view includes components above and below, as well as to one or more sides of a plurality of formed channel components, as well as other closely associated components. All of the components are considered to be formed by one or more methods including, but not limited to, punching, bending, laser cutting or combinations thereof with great precision, close tolerance and uniformity. Such components can be a panel or a formed channel or other associated structure, each being utilized to facilitate rapid component assembly and to produce a formed metal cabinet 12 having geometric uniformity and conformity.

The central portion of the formed metal cabinet 12 includes horizontally and vertically aligned components which are of precisely formed and punched metal configuration including vertically aligned full width formed channels 18, 20, 22 and 24, where full width formed channels 18 and 24 are located at the ends of the formed metal cabinet 12. Also included in the central portion are partial width formed mid-channels 26, 28 and 30 and formed end panels 32 and 34. Vertically oriented adhesive coated tapes 36 and 38, having an adhesive coating on opposite sides thereof and having a large central tape-free and adhesive-free region, are provided as sealing and attachment interfaces between the formed channel 18 and the formed end panel 32 and also between the formed channel 24 and the formed end panel 34 respectively. The double-sided adhesive coated tapes, such as tapes 36 and 38 and other such similar adhesive coated tapes incorporated herein, can be, but not limited to, 3M 5925 VHB (very high bond) Acrylic Foam Tape which is suitable for indoor or outdoor use. Other precisely formed and punched metal formations include a horizontally aligned formed top channel 40 and an opposed formed bottom channel 42 where the formed top channel 40 is aligned with and intimately secured to the top lips 18a, 20a, 22a and 24a of the formed channels 18, 20, 22 and 24, respectively, and to brackets 43 and 45, such as by a plurality of rivets 47, to the top of the formed channels 20 and 22, and to the tops of the formed mid-channels 26, 28 and 30, respectively, by the use of rivets 47, where such rivets 47 are commonly used at a plurality of locations along and about the invention. Similarly, the formed bottom channel 42 is attached to the bottom lips 18b, 20b, 22b and 24b of the formed channels 18, 20, 22 and 24 and the bottoms of the formed mid-channels 26, 28 and 30 by the use of rivets 47.

Front and rear support and backing surfaces for the formed metal cabinet 12 are also provided. The back side lips 18d, 20d, 22d and 24d of the full width formed channels 18, 20, 22 and 24 are notched at their tops and bottoms in order to be in flush alignment with the back side lip 40c of the formed top channel 40 and to a back side lip 42c of the formed bottom channel 42 in order to form a combined structure for backing and supporting a rear access panel 64 (shown in FIG. 3). Additionally, the back side lip 18d of the formed channel 18, the back side lip 40c of the formed top channel 40, the back side lip 42c of the formed bottom channel 42, and the back side lip 24d of the formed channel 24 form a rear rectangular perimeter structure 65 (FIG. 6) for accommodating of a vertically oriented adhesive coated tape 80, having an adhesive on opposite sides thereof and having a large central tape-free and adhesive-free region, as a sealing and attachment interface with the front surface of the rear access panel 64. In a related fashion, the front side lips 18c, 20c, 22c and 24c of the full width formed channels 18, 20, 22 and 24 and the front side lip 26c and corresponding side lips of the formed mid-channels 26, 28 and 30, respectively, are notched at their tops and bottoms in order to be in flush alignment with the front side lip 40b of the formed top channel 40 and with front side lip 42b of the formed bottom channel 42, thus forming a combined structure for backing and supporting the front mounting panel 16. Additionally, the front side lip 18c of the formed channel 18, the front side lip 40b of the formed top channel 40, the front side lip 42b of the formed bottom channel 42 and the front side lip 24c of the formed channel 24 form a front rectangular perimeter structure 67 (FIG. 2) for accommodating a vertically oriented adhesive coated tape 82 (FIGS. 3 and 6), having an adhesive coating on opposite sides thereof and having a large central tape-free and adhesive-free region, as a sealing and attachment interface with the rear surface of the mounting panel 16. Other precisely formed and punched metal formations include formed top and bottom panels 44 and 46. Horizontally oriented adhesive coated tapes 48 and 50, each tape having an adhesive on opposite sides thereof and having a large central tape-free and adhesive-free region, are provided as sealing and attachment interfaces between the formed top channel 40 and the top panel 44 and between the formed bottom channel 42 and the formed bottom panel 46, respectively.

Precision punched holes are provided in the various formed metal structures for use with rivets and nut inserts. Holes of various sizes are used for riveting and mounting and accommodation of nut inserts. For example and illustration, the method of riveting is described with brief reference to FIG. 5. A plurality of counter bored holes 52 are distributed along the formed top panel 44 in order to intimately engage the body of a rivet and to accommodate the head of a rivet in a flush fashion and, correspondingly, a plurality of body holes 54 are distributed along the main panel 40a of the formed top channel 40 in order to intimately engage and accommodate rivet bodies. Further, corresponding pluralities of clench holes 56 for intimate binding engagement with the flared bottom of rivets are provided for securing the formed top channel 40 and the formed top panel 44 to other components as follows. Clench holes 56 are provided in a top lip 18a of the formed end channel 18 and in the top lips of the other end channels. A plurality of clench holes 58 are provided in the segmented top lip 26a of the formed mid-channel 26, and a plurality of clench holes 60 are located in the top of the brackets 43 and 45. Other groups of clench holes 62 are distributed along the back and front side lips 40c and 40b, respectively, of the formed top channel 40 for fastening of the upper region of a rear access panel 64 and the upper region of the mounting panel 16, respectively. Corresponding holes for accommodating rivets are used in mirror image in corresponding like structures, such as the formed bottom channel 42 and the formed bottom panel 46, and are utilized in a similar manner for connecting the formed bottom channel 42 and the formed bottom panel 46 to the bottom lips 18b, 20b, 22b and 24b of the formed channels 18, 20, 22 and 24 and to the bottom lip 26b and other like corresponding lips of the formed mid-channels 26, 28 and 30.

Referring to FIG. 5, a plurality of nut inserts 66 are incorporated into the upper structure of the formed metal cabinet 12, as well as nut inserts 68, into the rear structure of the formed metal cabinet 12. Such nut inserts can be installed in other regions as required. A plurality of nut inserts 68, which secure through a plurality of counter bored holes 69 in the back side lip 18d of the formed channel 18 and through structural brackets 70, the latter of which are secured by rivets 47 to the main panel 18e of the formed channel 18, can be used for fastening the formed metal cabinet 12 to an external support structure. A plurality of structural brackets 71 are also provided and attached to the inside rear surface of the rear access panel 64 by rivets 47. Nut inserts 68 and associated structural brackets 70 are also installed in the same fashion in the formed channels 20, 22 and 24. Nut inserts 66 located at the upper region of the formed metal cabinet 12 can be used for the attachment of eye bolts or other suspension hardware. The formed top panel 44 includes a plurality of counter bored holes 72 distributed along and thereabout for flush accommodation of the annular top ring portion of the nut inserts 66, as well as for accommodation of the tubular section of the nut inserts 66 and for intimate engagement of the top portion of a nut insert 66 thereto and therein. A plurality of body holes 74 located along the formed top channel 40 allow passage of the tubular section of the nut inserts 66. A plurality of clench holes 76 in the top lip 18a of the formed end channel 18 and a plurality of clench holes 78 in the brackets 43 and 45 accommodate the tubular section of the nut inserts 66 for intimate engagement therewith by the flared bottom of the nut inserts 66. Body holes for nut inserts are also provided in the same manner in the formed channels 20, 22 and 24. The formed end panel 32 includes a plurality of counter bored holes 84 which accommodate a plurality of rivets 47 which are secured at a plurality of clench holes 86 located along and about the main panel 18e of the formed channel 18. The opposed formed end panel 34 is secured to the formed channel 24 in the same manner. A plurality of clench holes 88 are provided in lips 18c and 18d of the formed channel 18 and similar clench holes are also provided in the lips of the formed channels 20, 22 and 24 to thereby secure the mounting panel 16 and the rear access panel 64.

Other fastening features and components of the invention are now described with particular reference to FIG. 3. The rear access panel 64 has a plurality of openings 90a-90n therein for providing access to the interior of the formed metal cabinet 12. A plurality of counter bored holes 92 for accommodating the heads and bodies of nut inserts 68 and a plurality of clench holes 94 for accommodating a plurality of rivets 47 are located along and about the rear access panel 64 for use in fastening the rear access panel 64 to the rear of the central portion of the formed metal cabinet 12. More specifically, the rivets 47 (not shown in FIG. 3) are secured to the appropriately located clench holes 62 and through any other associated clench holes as applicably located in the formed top channel 40, as well as in the clench holes 88 in the back lips of the formed channels 18, 20, 22 and 24 and clench holes 89 in the back lip 42c of the formed bottom channel 42. A plurality of access door frames 96a-96n are attached, by rivets, to the rear access panel 64 around and about the openings 90a-90n therein. A plurality of removably attachable access door panels 98a-98n engage the access door frames 96a-96n and openings 90a-90n. A plurality of counter bored holes 100 are located along and about the perimeter of the front mounting panel 16 for accommodating the heads and bodies of rivets 47 which attach the front mounting panel 16 to the front area of the central portion of the formed metal cabinet 12. More specifically, rivets 47 are secured to the appropriately located clench holes 62 and to any other associated clench holes as applicably located in the front side lip 40b of the formed top channel 40, as well as in clench holes 88 (FIG. 5) located in the front side lips of the formed channels 18, 20, 22 and 24, the clench holes (not shown) in the front side lips of the formed mid-channels 26, 28 and 30 and the clench holes 89 in the front side lip 42b of the formed bottom channel 42.

Figure 6:
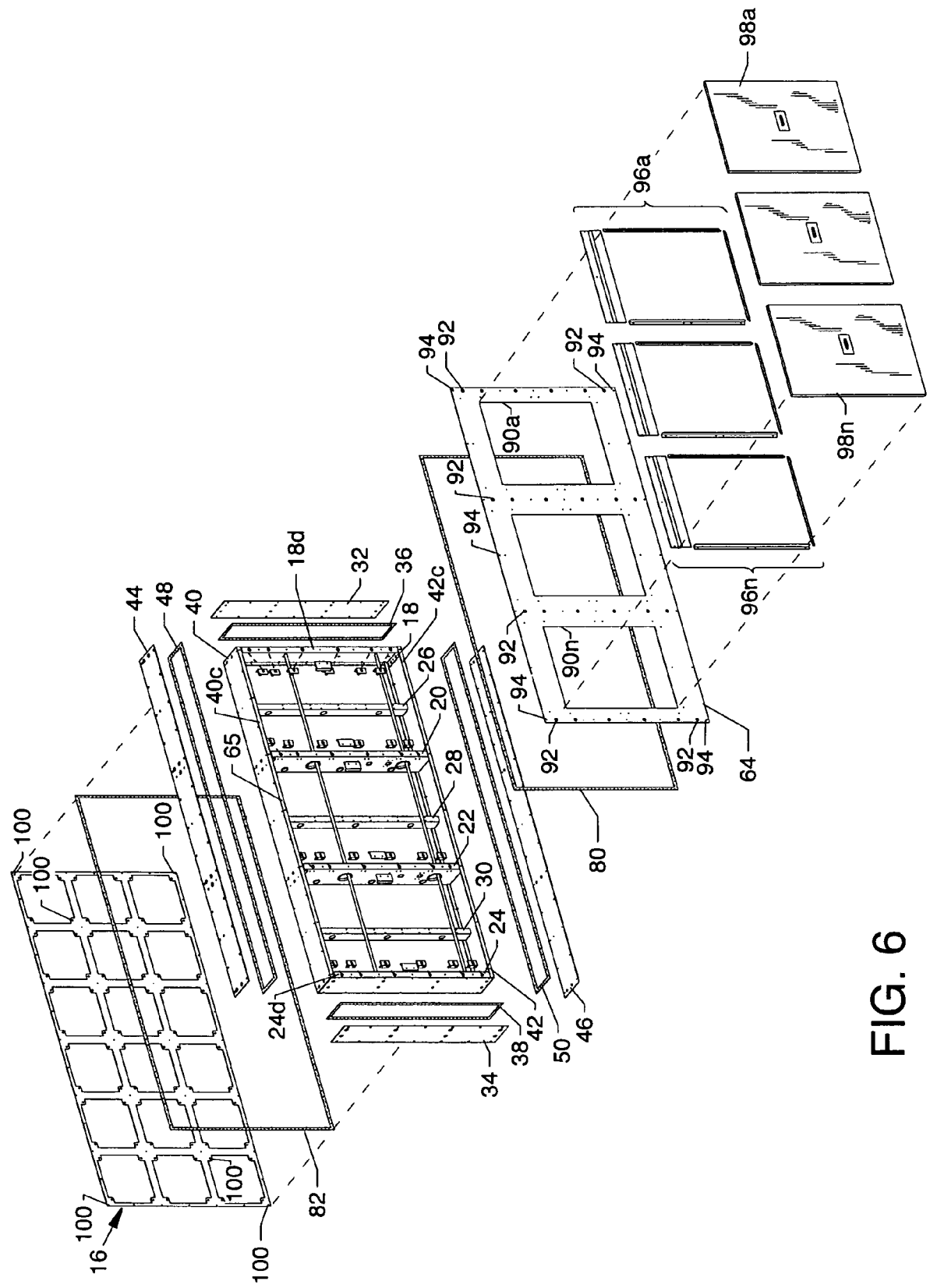
FIG. 6 is similar to FIG. 3 showing assembled centrally located components; and, FIG. 7 is a partially exploded view of the formed metal cabinet where the access door panels are shown distanced therefrom.

FIG. 6 is similar to FIG. 3 but shows the assembled centrally located components. The formed channels 18, 20, 22 and 24 and the formed mid-channels 26, 28 and 30 are shown secured between the formed top channel 40 and the formed bottom channel 42. The adhesive coated tape 48 is shown prior to its installation between the formed top channel 40 and the formed top panel 44, the adhesive coated tape 50 is shown prior to its installation between the formed bottom channel 42 and the formed bottom panel 46, the adhesive coated tape 38 is shown prior to its installation between the formed channel 24 and the formed end panel 34, and the adhesive coated tape 36 is shown prior to its installation between the formed channel 18 and the formed end panel 32.

Figure 7:
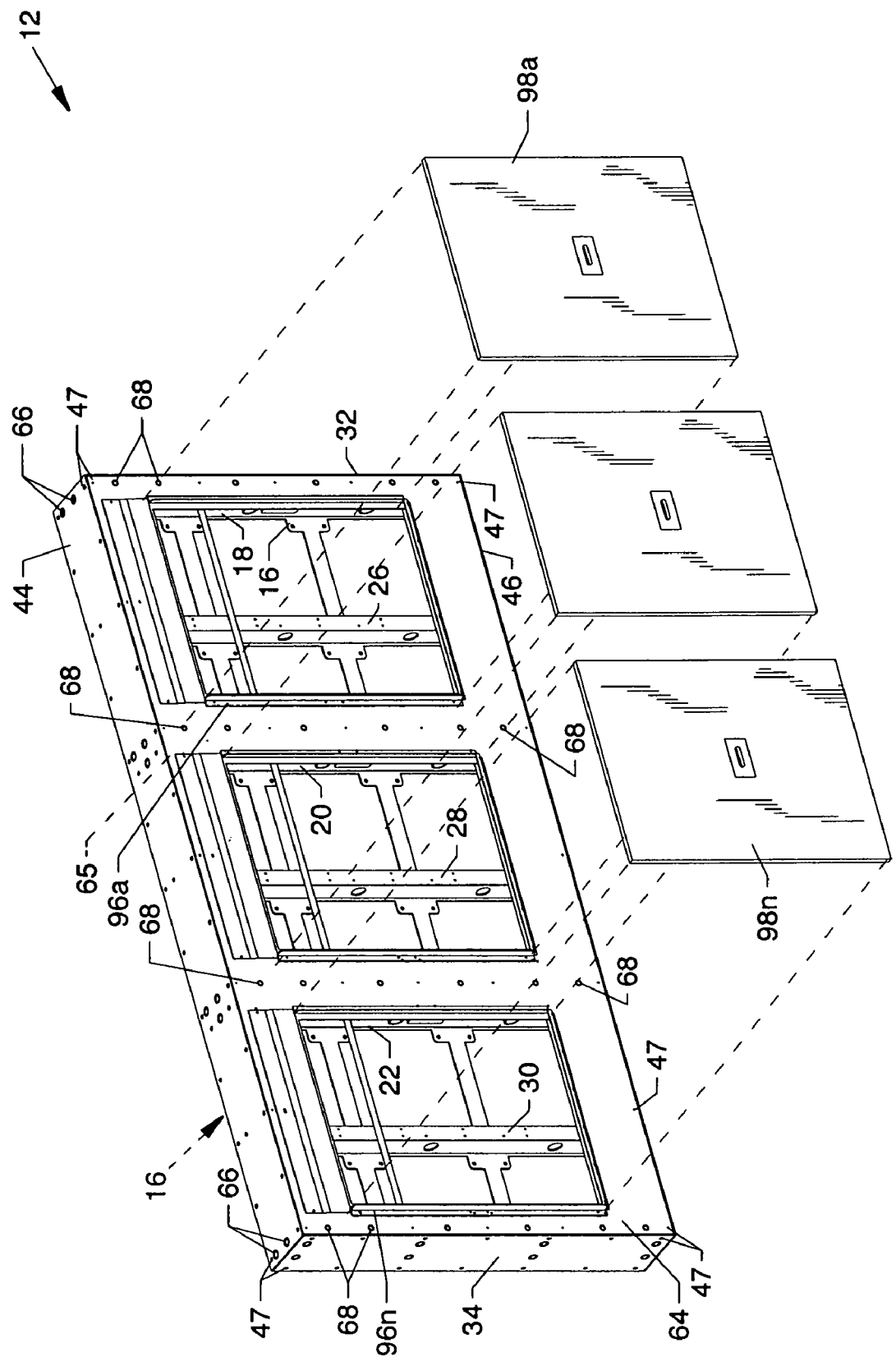

FIG. 7 is a partially exploded view of the formed metal cabinet 12 where the access door panels 98a-98n are shown distanced from the main structure. The formed top panel 44 is secured to the formed top channel 40 by the use of rivets 47 and nut inserts 66 and by the adhesive coated tape 48 (not shown) therebetween. The formed bottom panel 46 is secured to the formed bottom channel 42 by the use of rivets 47 and by the adhesive coated tape 48 (not shown) therebetween. The formed end panel 34 is secured to the formed end channel 24 by the use of rivets 47 and by the adhesive coated tape 38 (not shown) therebetween. The formed end panel 32 is secured to the formed end channel 18 by the use of rivets 47 and by the adhesive coated tape 36 (not shown) therebetween. The rear access panel 64 is shown fastened to the rear rectangular perimeter structure 65 by the use of rivets 47 and nut inserts 66 and by the adhesive coated tape 80 (not shown) therebetween. The mounting panel 16 is shown fastened to the front rectangular perimeter structure 67 (FIG. 2) by the use of rivets 47 and by the adhesive coated tape 82 (not shown) therebetween.

Mode of Operation

Pluralities of precise and close tolerance formed planar panels, formed channels, a mounting panel, a rear access panel and other closely associated components are assembled using adhesive coated tapes interfacing between multiple arrangements in conjunction and in combination with pluralities of rivets and nut inserts which together mutually secure and attach such components.

Various modifications can be made to the present invention without departing from the apparent scope thereof.

It is claimed:

1. A formed metal cabinet for an electronic sign including:
   a formed structure including:
      a plurality of elongated vertical spaced formed channels,
      a pair of elongated horizontal spaced formed channels coupled across opposite ends of the vertical spaced formed channels, the pair of horizontal spaced formed channels include a top channel and a bottom channel, and
      wherein one or more of the plurality of vertical spaced formed channels and the horizontal spaced formed channels include a plurality of lips projecting at angles relative to the remainder of the channels, and the plurality of lips include open notches;
   a panel assembly including:
      a front mounting panel coupled over the plurality of vertical spaced formed channels and the pair of horizontal spaced formed channels, the front mounting panel includes a plurality of windows sized shaped to receive electronic display modules;
      a rear access panel coupled over the plurality of vertical spaced formed channels and the pair of horizontal spaced formed channels, the rear access panel includes one or more access openings therein;
      one or more side, top and bottom planar panels coupled over corresponding vertical spaced formed channels, the top channel or the bottom channel of the formed structure;
      one or more adhesive seals interposed between the perimeters of the front mounting panel, rear access panel, one or more side, top and bottom planar panels and the corresponding vertical spaced formed channels, top channel or bottom channel of the formed structure, the panels of the panel assembly and adhesive seals conceal the open notches in the channels and seal off the formed structure from an environment exterior to the panel assembly.

2. The formed metal cabinet of claim 1 further comprising electronic display modules fit within the plurality of windows.

3. The formed metal cabinet of claim 1, wherein the vertical and horizontal spaced formed channels and the side, top and bottom panels extends continuously from the front mounting panel to the rear access panel.

4. The formed metal cabinet of claim 1, wherein the top and bottom planar panels are coupled with one or more of the vertical spaced formed channels with fasteners and the top and bottom channels are retained between the corresponding top and bottom planar panels and the vertical spaced formed channels.

5. The formed metal cabinet of claim 4, wherein the top and bottom planar panels include counter bored holes sized and shaped to flushly receive fastener heads of the fasteners, and the top and bottom planar panels include top and bottom planar exterior surfaces flush with the fastener heads.

6. The formed metal cabinet of claim 5, wherein the side planar panels include counter bored holes sized and shaped to flushly receive fastener heads of fasteners and the side planar panels include side planar exterior surfaces flush with the with the fastener heads, and the side planar exterior surfaces and the top and bottom planar exterior surfaces form a planar exterior perimeter around the panel assembly and the formed structure.

7. The formed metal cabinet of claim 4, wherein one or more of the vertical and horizontal spaced formed channels includes clench holes sized and shaped to accommodate the fasteners.

8. The formed metal cabinet of claim 1, wherein the fasteners include rivets and nut inserts.

9. The formed metal cabinet of claim 1, wherein the plurality of vertical spaced formed channels include vertical end channels and one or more vertical mid-channels between the vertical end channels.

10. The formed metal cabinet of claim 1, wherein the one or more adhesive seals includes a double-sided adhesive coated tape.

11. The formed metal cabinet of claim 1, wherein one or more of the plurality of vertical spaced formed channels include an elongated section and one or more front side, back side, top and bottom lips extending at an angle relative to the elongated section.

12. A formed metal cabinet comprising:
   a formed structure including:
      two or more elongated vertical spaced formed channels,
      two or more elongated horizontal spaced formed channels coupled across ends of the vertical spaced formed channels, and
      wherein at least one of the vertical spaced formed channels and the horizontal spaced formed channels include one or more lips projecting at angles relative to the remainder of the channels, and the plurality of lips include open notches; and
   a panel assembly overlying and sealing the formed structure, the panel assembly including:
      one or more panels coupled over one or more of the vertical spaced formed channels and the horizontal spaced formed channels, and
      one or more adhesive seals interposed between perimeters of each of the one or more panels and the vertical and horizontal spaced formed channels underlying each of the panels, the plurality of panels and adhesive seals conceal the open notches in the channels and seal off the formed structure from an environment exterior to the panel assembly.

13. The formed metal cabinet of claim 12, wherein the vertical and horizontal spaced formed channels and side panels of the one or more panels extends continuously from a front mounting panel to a rear access panel.

14. The formed metal cabinet of claim 12, wherein the one or more panels are coupled with one or more of the vertical spaced formed channels with fasteners and one or more of the horizontal spaced formed channels are retained between the one or more panels and the one or more vertical spaced formed channels.

15. The formed metal cabinet of claim 14, wherein the fasteners include rivets and nut inserts.

16. The formed metal cabinet of claim 12, wherein the one or more panels include counter bored holes sized and shaped to flushly receive fastener heads of fasteners, and the one or more panels include exterior surfaces flush with the fastener heads, and the one or more panels form a planar exterior perimeter around the formed structure.

17. The formed metal cabinet of claim 12, wherein the one or more panels include side, top and bottom, front mounting and rear access panels.

18. The formed metal cabinet of claim 12, wherein the one or more panels include a front mounting panel including a plurality of windows sized and shaped to receive electronic display modules.

19. The formed metal cabinet of claim 12, wherein the one or more panels include a rear access panel including one or more access openings sized and shaped to receive access door panels.

20. The formed metal cabinet of claim 12, wherein one or more of the vertical and horizontal spaced formed channels includes clench holes sized and shaped to accommodate fasteners.

21. The formed metal cabinet of claim 12, wherein the two or more vertical spaced formed channels include vertical end channels and one or more vertical mid-channels between the vertical end channels.

22. The formed metal cabinet of claim 12, wherein the one or more adhesive seals includes a double-sided adhesive coated tape.

23. The formed metal cabinet of claim 12, wherein one or more of the vertical spaced formed channels include an elongated section and one or more front side, back side, top and bottom lips extending at an angle relative to the elongated section.

24. A method for making a formed metal cabinet comprising:
    assembling a formed structure including:
        coupling two or more elongated vertical spaced formed channels with two or more elongated horizontal spaced formed channels, and the vertical spaced formed channels and the horizontal spaced formed channels include a plurality of lips projecting at angles relative to the remainder of the channels, and the plurality of lips include open notches; and
    coupling a panel assembly over the formed structure and sealing the formed structure including:
        positioning one or more panels over one or more of the vertical spaced formed channels and the horizontal spaced formed channels, a perimeter of each of the one or more panels overlying the one or more vertical and horizontal spaced formed channels, and
        interposing one or more adhesive seals between the perimeter of each of the one or more panels and the one or more vertical and horizontal spaced formed channels underlying each of the panels, the one or more panels and adhesive seals conceal the open notches in the channels and seal off the formed structure from an environment exterior to the panel assembly.

25. The method for making the formed steel cabinet of claim 24, wherein coupling two or more elongated vertical spaced formed channels with two or more elongated horizontal formed channels includes coupling the one or more panels with one or more of the vertical spaced formed channels and at least one horizontal spaced formed channel is interposed therebetween.

26. The method for making the formed steel cabinet of claim 24, wherein coupling a panel assembly over the formed structure includes forming a planar exterior perimeter around the formed structure, wherein fasteners extending between the one or more panels and one or more of the vertical and horizontal spaced formed channels include fastener heads flushly received within counter bored holes.

27. The method for making the formed steel cabinet of claim 24 further comprising positioning electronic display modules within a plurality of windows in a front mounting panel of the one or more panels.

28. The method for making the formed steel cabinet of claim 24, wherein interposing one or more adhesive seals between the perimeter of each of the one or more panels and the one or more vertical and horizontal spaced formed channels includes applying a double-sided adhesive coated tape to the one or more panels and the one or more vertical and horizontal spaced formed channels.

29. The method for making the formed steel cabinet of claim 24, wherein coupling two or more elongated vertical spaced formed channels with two or more elongated horizontal spaced formed channels includes positioning at least one of the plurality of lips within one of the open notches.

* * * * *